(12) United States Patent
Ohashi

(10) Patent No.: US 9,331,657 B2
(45) Date of Patent: May 3, 2016

(54) BUS BAR WITH NOISE FILTER

(71) Applicant: KITAGAWA INDUSTRIES CO., LTD., Inazawa-shi, Aichi (JP)

(72) Inventor: Yoshinori Ohashi, Inazawa (JP)

(73) Assignee: KITAGAWA INDUSTRIES CO., LTD., Inazawa-Shi, Aichi (JP)

( * ) Notice: Subject to any disclaimer, the term of this patent is extended or adjusted under 35 U.S.C. 154(b) by 57 days.

(21) Appl. No.: 14/364,558

(22) PCT Filed: Sep. 13, 2013

(86) PCT No.: PCT/JP2013/074902
§ 371 (c)(1),
(2) Date: Jun. 11, 2014

(87) PCT Pub. No.: WO2014/050616
PCT Pub. Date: Apr. 3, 2014

(65) Prior Publication Data
US 2014/0326499 A1     Nov. 6, 2014

(30) Foreign Application Priority Data

Sep. 28, 2012  (JP) .................................. 2012-216755
Mar. 26, 2013  (JP) .................................. 2013-064064

(51) Int. Cl.
*H03H 1/00* (2006.01)
*H02G 5/06* (2006.01)
(Continued)

(52) U.S. Cl.
CPC ............... *H03H 1/0007* (2013.01); *H02G 5/06* (2013.01); *H03H 7/01* (2013.01); *H01F 2017/065* (2013.01); *H03H 2001/0028* (2013.01); *H03H 2001/0057* (2013.01)

(58) Field of Classification Search
CPC ................. H03H 1/00; H03H 1/0007; H03H 2001/0028; H03H 2001/0057; H01F 2017/065
USPC ........................................ 333/181, 182, 185
See application file for complete search history.

(56) References Cited

U.S. PATENT DOCUMENTS 5,838,216 A  * 11/1998 White ........................ H01G 4/35
                                                                    333/182
2008/0094152 A1   4/2008 Hofsajer
2011/0031805 A1   2/2011 Yamashita et al.

FOREIGN PATENT DOCUMENTS

EP        1633023 A2      3/2006
JP        63-245001      10/1988
(Continued)

OTHER PUBLICATIONS

International Search Report dated Nov. 5, 2013, for International Patent Application No. PCT/JP2013/074902.
(Continued)

*Primary Examiner* — Benny Lee
*Assistant Examiner* — Albens Dieujuste
(74) *Attorney, Agent, or Firm* — Thomas & Karceski, PC

(57) ABSTRACT

A bus bar device with a noise filter includes a magnetic body, a bus bar and first to third capacitors. The bus bar has input and output ends and extends through the magnetic body. The capacitors are disposed on an electrical path between the bus bar and a ground conductor surface. The first capacitor is located at the input end side of the bus bar and the second and third capacitors are located at the output end side. The first capacitor has one end connected to the bus bar and the other end connected to the ground conductor surface in one of two regions divided by the bus bar. Each one of the second and third capacitors has one end connected to the bus bar and the other end connected to the ground conductor surface in the same region as the first capacitor or in the other region.

4 Claims, 10 Drawing Sheets

(51) Int. Cl.
*H03H 7/01* (2006.01)
*H01F 17/06* (2006.01)

(56) References Cited

FOREIGN PATENT DOCUMENTS

| JP | H05-1208 | 1/1993 |
| JP | 07-283679 | 10/1995 |
| JP | 11-176498 | 7/1999 |
| JP | 2005-093658 | 4/2005 |
| JP | 2009-248748 | 10/2009 |
| JP | 2012-129631 | 7/2012 |

OTHER PUBLICATIONS

European Extended Search Report dated Aug. 28, 2015, for European Patent Application No. 13841581.5.

\* cited by examiner

BUS BAR WITH NOISE FILTER

CROSS-REFERENCE TO RELATED APPLICATION(S)

This Non-Provisional Patent Application is a National Stage Entry into the United States Patent and Trademark Office from International Patent Application No. PCT/JP2013/074902, having an international filing date of Sep. 13, 2013, and which claims priority both to Japanese Patent Application No. 2013-064064, filed Mar. 26, 2013, and to Japanese Patent Application No. 2012-216755, filed Sep. 28, 2012, the entire contents of all of which are incorporated herein by reference.

FIELD OF THE INVENTION

The present invention relates to a bus bar device with a noise filter.

DESCRIPTION OF RELATED ART

Bus bars have been conventionally used as an alternative for conductive wires and the like in electrical equipment widely. Since the bus bars are used in electrical equipment treating large current, high-frequency noise components resulting from operation of the equipment such as switching have been required to be canceled. A noise filter comprising a coil and capacitors has been proposed to be added to bus bars (Japanese Patent Application Publication No. H11-176498, hereinafter "JP '498"). In JP '498, a line control (LC) circuit configured of a coil and capacitors, or the like is used to attenuate noise produced from a bus bar and noise propagating through the bus bar.

However, radiation characteristics of noise radiated from the bus bar differ depending upon electrical equipment in which the bus bar is incorporated. More specifically, noise radiated from the bus bar differs in a frequency range and required attenuation depending upon electrical equipment to be connected to the bus bar. Accordingly, components such as capacitors, coil and a casing are required to be designed individual exclusive components according to electrical equipment to which the bus bar is applied. This results in a problem that general versatility is low.

SUMMARY OF THE INVENTION

An object of the invention is to provide a bus bar device with a noise filter, which is easy in adjustment of noise cancellation characteristic according to the characteristics of electrical equipment to which the bus bar device is connected and has a high general versatility.

In one embodiment of the invention, capacitors are provided at an input end side and an output end side of a bus bar with a magnetic body being interposed therebetween for connecting between the bus bar and a ground conductor surface respectively. More specifically, the first capacitor is provided on an electrical path connecting between the bus bar and the ground conductor surface and located at the input end side of the bus bar with respect to the magnetic body. The second capacitor is provided on the electrical path connecting between the bus bar and the ground conductor surface and located at the output end side of the bus bar with respect to the magnetic body. A third capacitor is provided on the electrical path and located at the output end side of the bus bar with respect to the magnetic body. An attenuation amount of noise to be eliminated changes depending upon which one of the sides of the ground conductor surface with the bus bar being interposed therebetween. Accordingly, even if the electrical characteristics of the ferrite core, such as impedance, are constant, a noise elimination characteristic changes by changing connection paths of the first and second capacitors. More specifically, no dedicated ferrite core, first and second capacitors need not be designed according to electrical equipment to be connected to the bus bar device. Accordingly, components including the bus bar and the ferrite core can be commonalized, and a noise elimination characteristic can be easily adjusted according to the characteristics of an electrical equipment to be connected to the bus bar device.

Furthermore, frequency range of noise to be eliminated changes by changing the connection paths of the second and third capacitors located at the output end side with respect to the magnetic body. Accordingly, even if the electrical characteristics of the ferrite core, such as impedance, are constant, a noise elimination characteristic changes by changing connection paths of the second and third capacitors. In other words, the frequency range of noise to be eliminated is easily adjusted by adjusting the connection paths of the respective capacitors such as the third capacitor according to electrical equipment to be connected. Accordingly, components can be commonalized and a noise elimination characteristic can be easily adjusted according to the characteristics of an electrical equipment to be connected.

In a further embodiment of the bus bar device, the bus bar has a part connected to the first capacitor and the part is located nearer the ground conductor surface than another part of the bus bar extending through the magnetic body. A change occurs in the noise elimination characteristic in a particular frequency range when a part of the bus bar to which the first capacitor is connected is caused to come near the bottom. Accordingly, the frequency range of noise to be eliminated can be easily adjusted by changing the distance between the bus bar 13 and the bottom as well as the capacity of the first capacitor. This can enhance commonalization of components and adjust the noise elimination characteristic with ease and high degree of accuracy according to characteristics of electrical equipment to be connected.

In still another embodiment of the bus bar device, the bus bar includes a concave part or is formed into a concavo-convex shape such that a distance to the ground conductor surface changes. As a result, the whole length of the bus bar is increased even though the distance from the input end to the output end remains unchanged. Accordingly, electrical constants of the bus bar, such as a resistance value or impedance, change, resulting in a change in the noise elimination characteristic. Furthermore, forming the bus bar into the concave or concavo-convex shape provides easy adjustment of the distance from the part of the bus bar extending through the magnetic body to the ground conductor surface and the distance from a part to which each capacitor is connected to the ground conductor surface. This can easily adjust the noise elimination characteristic without increase in the size of the bus bar device.

In one further embodiment of the bus bar device, the bus bar and an earth bar extend through the opening of the ferrite core and a capacitor is formed by the dielectric member between the bus bar and earth bar. Accordingly, the ferrite core, the bus bar, the earth bar and the dielectric member are configured into an integral unit. Furthermore, the frequency range of noise to be eliminated is easily adjusted by adjusting a dielectric factor of the dielectric member inserted between the bus bar and the earth bar, the shapes of the bus bar and the earth bar, and the like. This can enhance commonalization of components such as the ferrite core and adjust the noise elimination characteristic with ease and high degree of accuracy according to characteristics of electrical equipment to be connected. Additionally, since the components are configured into an integral unit, the handling of the bus bar device can be rendered easier.

BRIEF DESCRIPTION OF THE DRAWINGS

The present invention is described in connection with the figures appended hereto, in which.

DETAILED DESCRIPTION OF EMBODIMENTS OF THE INVENTION

Embodiments of the bus bar device with the noise filter (hereinafter, "bus bar device") will be described with reference to the drawings. The bus bar device is applied to a DC/DC converter used in a hybrid vehicle, for example.

First Embodiment

Figure 1:
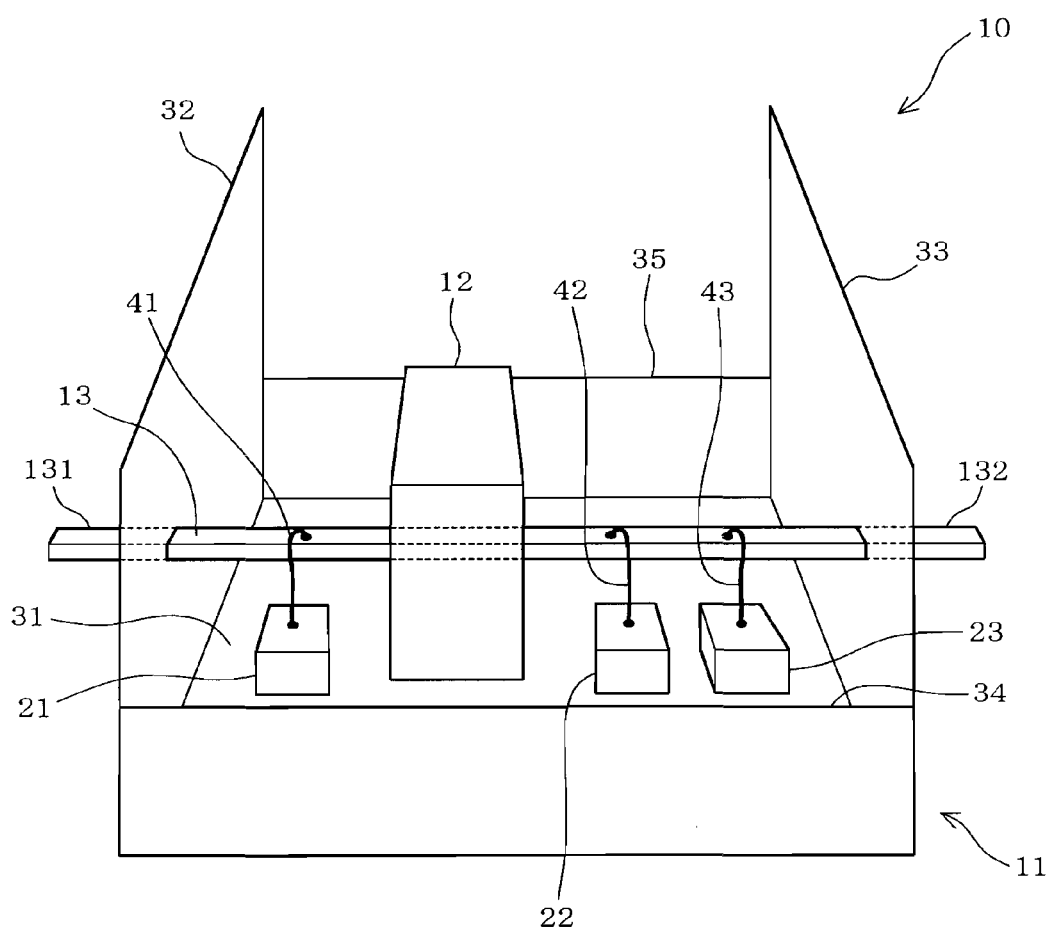
FIG. 1 is a schematic perspective view of a bus bar device with a noise filter, according to a first embodiment.
Figure 2:
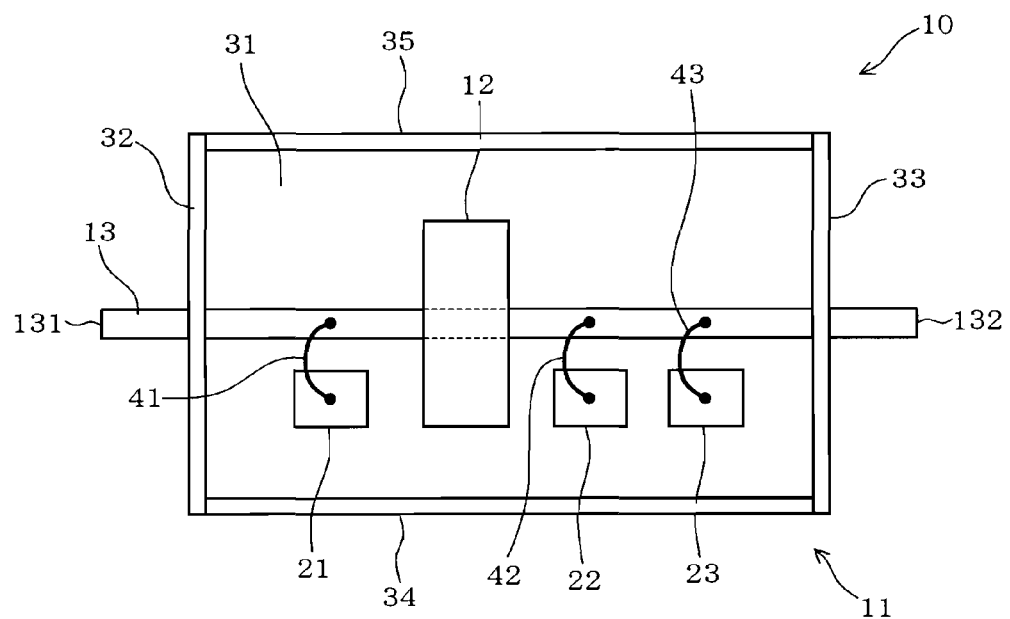
FIG. 2 is a schematic plan view of the bus bar device.

The bus bar device 10 of the first embodiment is installed on a dielectric body such as a casing 11 as shown in FIGS. 1 and 2. The bus bar device 10 includes a ferrite core 12 as a magnetic body, a bus bar 13, a first capacitor 21, a second capacitor 22 and a third capacitor 23. The casing 11 is formed of an electrically conductive metal such as aluminum or an alloy into a box shape. The box-shaped casing 11 has a bottom 31, an input frame 32, an output frame 33, a side frame 34 and a side frame 35. The bottom 31 is formed into a rectangular plate shape. The bottom 31 serves as a ground conductor surface. Although the casing 11 is used as a conductive body forming the ground conductor surface in the embodiment, the ground conductor surface should not be limited to the casing 11. For example, the bus bar device 10 may be a metal component exposed in an environment where the bus bar device 10 is installed, instead of the casing 11. For example, when mounted on a hybrid vehicle, the bus bar device 10 can use, as the ground conductor surface, a dielectric body such as a metal case of a DC/DC converter.

The input frame 32, the output frame 33 and the side frames 34 and 35 of the casing 11 used in the embodiment rise from four sides of the rectangular bottom 31 respectively. More specifically, the input frame 32 rises from one of the four sides of the bottom 31. The output frame 33 rises from a side opposed to the input frame 32. Accordingly, the input and output frames 32 and 33 are substantially in parallel to each other. The side frame 34 rises from a side connecting between the input and output frames 32 and 33. The side frame 35 rises from a side opposed to the side frame 34 in the same manner. Accordingly, the side frames 34 and 35 are in parallel to each other. Thus, the side frames 34 and 35 each connect between the input and output frames 32 and 33. The casing 11 is grounded and a potential thereof corresponds to ground GND. The side frames 34 and 35 of the casing 11 may be eliminated.

The bus bar 13 is formed of an electrically conductive metal or alloy, for example, a conductive metal such as copper or an alloy. The bus bar 13 has an input end 131 and an output end 132 both extending between the input and output frames 32 and 33 of the casing 11. The bus bar 13 extends through the ferrite core 12 from the input side to the output side. Accordingly, when the bus bar 13 is viewed from above as shown in FIG. 2, the bottom 31 of the casing 11 serving as the ground is divided by the bus bar 13 into two regions. More specifically, when the bus bar 13 is caused to extend through the casing 11, the casing 11 is divided into a side frame 34 side region and a side frame 35 side region. An insulating member (not shown) insulates between the bus bar 13 and the input and output frames 32 and 33 of the casing 11. The input end 131 of the bus bar 13 is to be connected to a power supply (not shown) or the like. On the other hand, the output end 132 of the bus bar 13 is to be connected to a load such as an electric motor (not shown). Thus, the bus bar 13 connects the input side such as the power supply and the output side such as a drive device to each other. The bus bar 13 may be linear from the input end 131 to the output end 132 or may be bent midway into a concavo-convex shape. When formed into the concavo-convex shape, the bus bar 13 is bent in the up-down direction in FIG. 1 so that the distance to the bottom changes.

The ferrite core 12 is provided between the input and output ends 131 and 132 of the bus bar 13. As a result, the bus bar 13 extends through the ferrite core 12. More specifically, the ferrite core 12 has an opening (not shown) in a central part thereof and is formed into a cylindrical shape. The bus bar 13 extends through the opening of the ferrite core 12.

The first capacitor 21 is provided on a first path 41 which is an electrical path connecting between the bus bar 13 and the bottom 31 of the casing 11 serving as the ground conductor surface. More specifically, the first path 41 electrically connects between the bus bar 13 and the bottom 31. The first path 41 thus connects between the bus bar 13 and either the side frame 34 side region or the side frame 35 side region of the bus bar 13. In other words, the first path 41 may connect between the bottom 31 and the bus bar 13 in the region located at the side frame 34 side with respect to the bus bar 13 or in the region located at the side frame 35 side with respect to the bus bar 13. The first path 41 connects between the bus bar 13 and the bottom 31 at the input end 131 side or the input frame 32 side with respect to the ferrite core 12. A first capacitor 21 is provided on the first path 41. The first capacitor 21 may connect between the bus bar 13 and either side frame 34 or 35 but not the bottom 31. In this case, the side frame 34 or 35 serves as a ground conductor surface. The first capacitor 21 provided on the first path 41 is located in the region at the side frame 34 side of the bottom 31 in the embodiment.

Similarly, a second capacitor 22 is provided on a second path 42 which is an electrical path connecting between the bus bar 13 and the bottom 31. More specifically, the bus bar 13 and the bottom 31 are electrically connected to each other by the second path 42. The second path 42 thus connects between the bus bar 13 and the same region as in the case of the first capacitor 21 or a region different from that in the case of the first capacitor. In other words, the second path 42 may connect between the bottom 31 and the bus bar 13 in the same region as that in the case of the first capacitor 41 or in the region different from that in the case of the first capacitor 41. The second path 42 connects between the bus bar 13 and the bottom 31 at the output end 132 side or the output frame 33 side with respect to the ferrite core 12. The second capacitor 22 is provided on the second path 42. The second capacitor 22 may connect between the bus bar 13 and either side frame 34 or 35 but not the bottom 31. In this case, the side frame 34 or 35 serves as a ground conductor surface.

Thus, both the first path 41 provided with the first capacitor 21 and the second path 42 provided with the second capacitor 22 are located at the input or output side with the ferrite core 12 being interposed between the first and second paths 41 and 42. The bus bar device 10 may include a third capacitor 23 in addition to the first and second capacitors 21 and 22.

The third capacitor 23 is provided on a third electrical path connecting between the bus bar 13 and the bottom 31. More specifically, the bus bar 13 and the bottom 31 are electrically connected to each other by the third path 43. The third path 43 thus connects between the bus bar 13 and the same region as in the case of the first capacitor 21 or a region different from that in the case of the first capacitor 21. In other words, the third path 43 may connect between the bottom 31 and the bus bar 13 in the same region as that in the case of the first capacitor 41 or in the region different from that in the case of the first capacitor 41. The third path 43 connects between the bus bar 13 and the bottom 31 at the output end 132 side or the output frame 33 side. A third capacitor 23 is provided on the third path 43. The third capacitor 23 may connect between the bus bar 13 and either side frame 34 or 35 but not the bottom 31. In this case, the side frame 34 or 35 serves as a ground conductor surface. FIGS. 1 and 2 show an example in which the first, second and third capacitors 21, 22 and 23 are connected directly to the bottom 31. However, the first to third capacitors 21 to 23 may be provided in the middle of electrical wirings of the first, second and third paths 41, 42 and 43 respectively. More specifically, wirings may be provided between the first to third capacitors 21 to 23 and the bottom 31 respectively.

The operation of thus constructed bus bar device 10 will be described in detail based on a plurality of examples.

Figure 3:
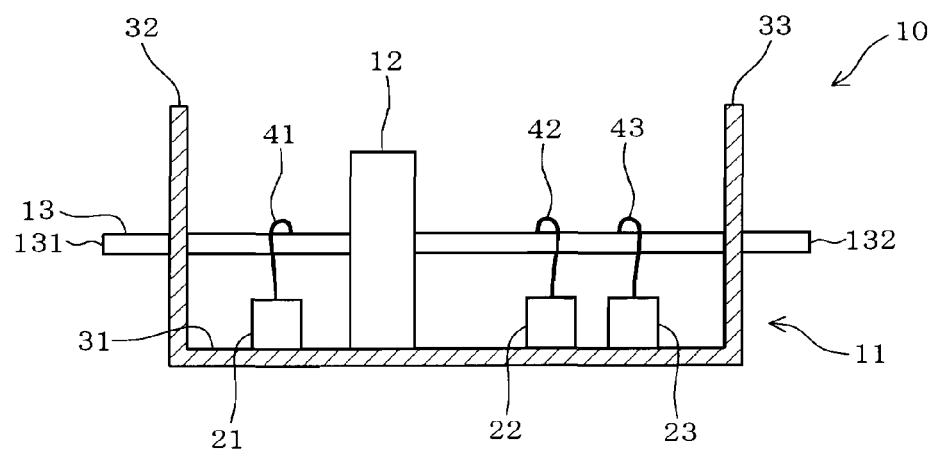
FIG. 3 is a schematic sectional view of the bus bar device of example 1 according to the first embodiment.
Figure 4:
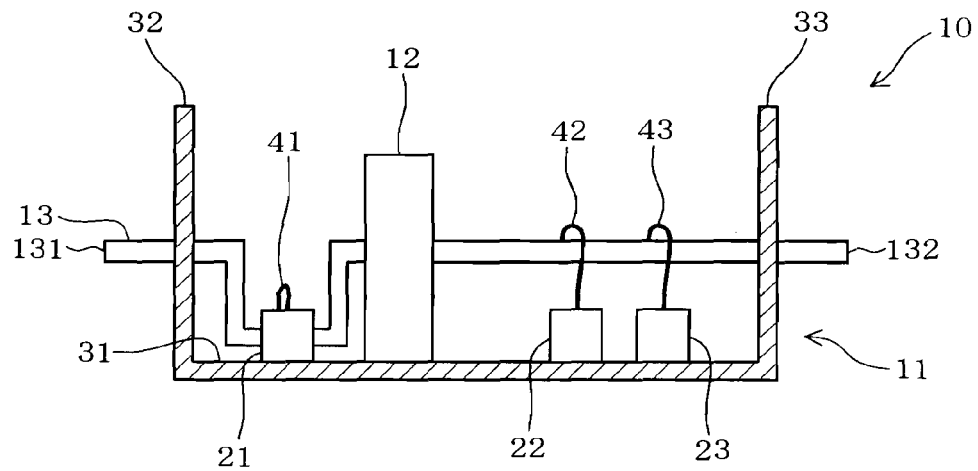
FIG. 4 is a schematic sectional view of the bus bar device of example 2 according to the first embodiment.
Figure 5:
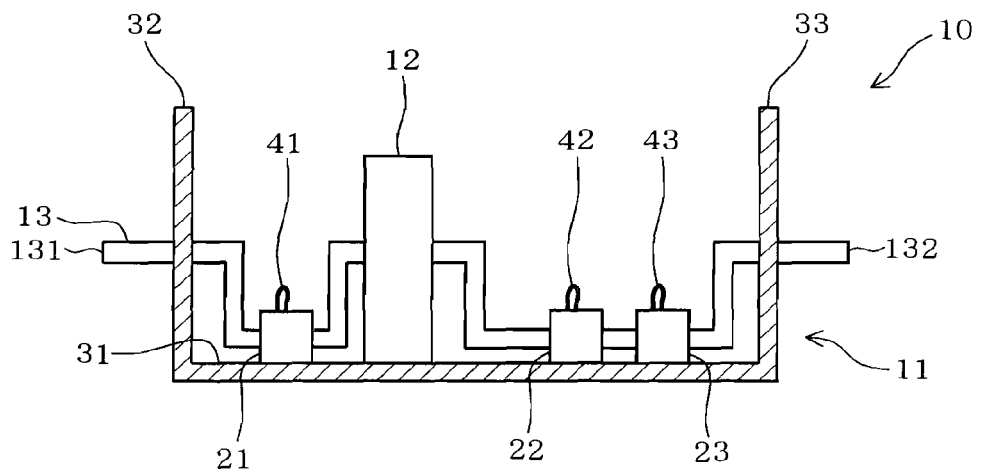
FIG. 5 is a schematic sectional view of the bus bar device of example 2 according to the first embodiment.

Changes in a damping characteristic depending upon the shape of the bus bar 13 will be studied regarding examples 1, 2 and 3 as shown in FIGS. 3, 4 and 5 respectively. The bus bar device 10 of example 1 shown in FIG. 3 includes a bus bar 13 which is formed into a linear plate shape. The bus bar device 10 of example 2 shown in FIG. 4 includes a bus bar 13 in which the input frame 32 side of the ferrite core 12 is bent to the bottom 31 side. The bus bar device 10 of example 3 shown in FIG. 5 includes a bus bar 13 in which the input frame 32 side and the output frame 33 side of the ferrite core 12 are bent to the bottom 31 side.

Each one of the bus bar devices 10 of examples 1 to 3 includes the first capacitor 21 provided at the input frame 32 side with respect to the ferrite core 12 and the second and third capacitors 22 and 23 both provided at the output frame 33 side with respect to the ferrite core 12. Furthermore, the first to third capacitors 21 to 23 are disposed in the side frame 34 side region with respect to the bus bar 13 in each of the bus bar devices 10 of examples 1 to 3, as shown in FIG. 2. Elements other than the shape of bus bar 13 are common to these bus bar devices 10. More specifically, characteristics of the ferrite core 12 and capacities of the first to third capacitors 21 to 23, and the like are common to these bus bar devices 10.

Figure 6:
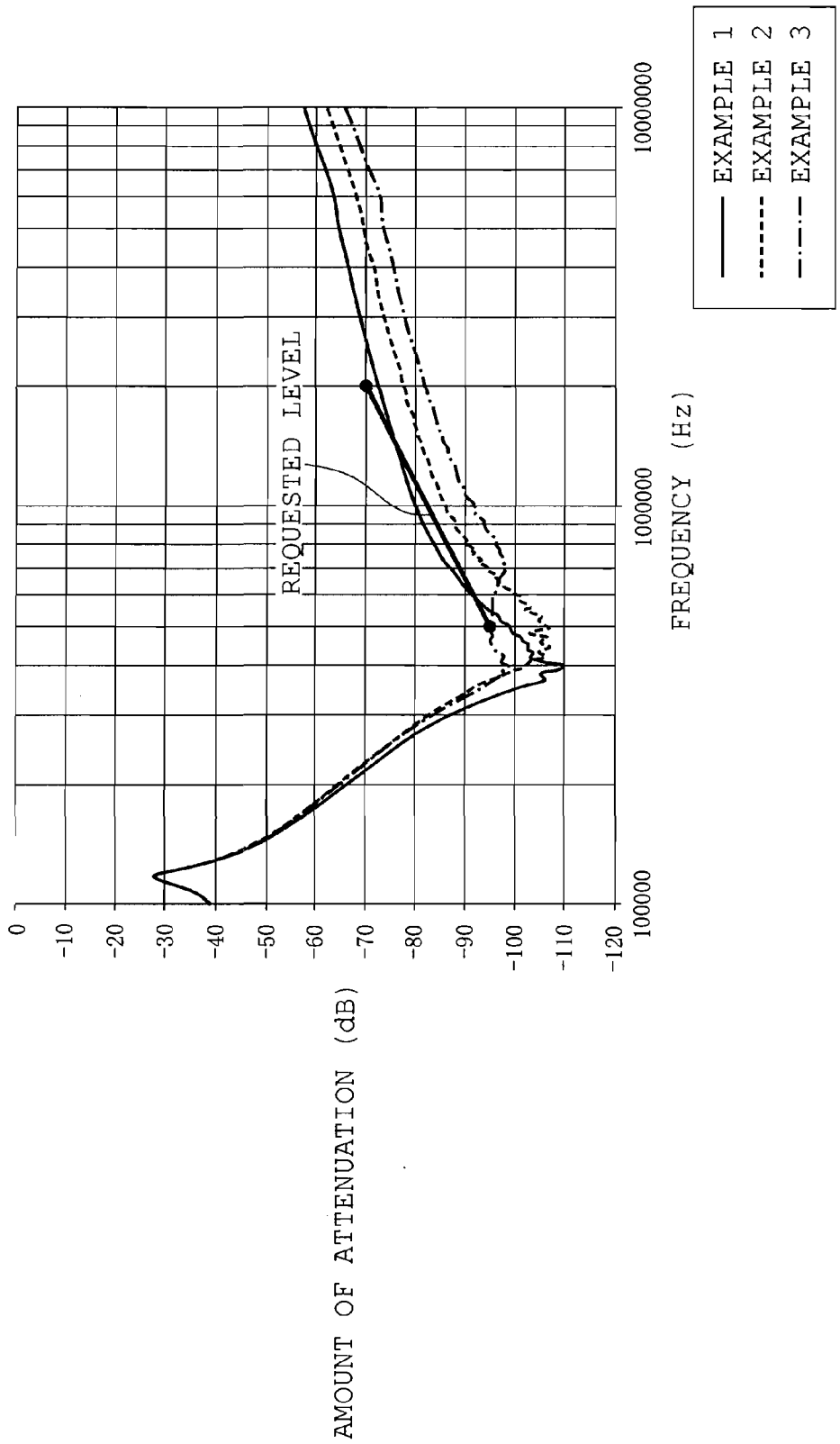
FIG. 6 is a graph showing relationship between frequency and attenuation.

FIG. 6 shows the relationship between a frequency range and amounts of attenuation in the bus bar devices 10 of examples 1 to 3. It is understood from FIG. 6 that the relationship between the frequency range and the attenuation amount changes depending upon the shape of the bus bar 13. The linear bus bar 13 as in example 1 shows a narrow frequency range of noise attenuation but achieves a large amount of attenuation in spite of the narrow frequency range. On the other hand, the concave and concavo-convex linear bus bars 13 as in examples 2 and 3 show broader frequency ranges and more stable amounts of attenuation as compared with example 1, respectively. When compared with example 2, example 3, in which both input frame 32 side and output frame 33 side of the ferrite core 12 are bent, shows a broader frequency range and a more stable amount of attenuation than example 2. These results show that the linear bus bar 13 as in example 1 is suitable for attainment of a large amount of attenuation in a narrow frequency range. On the other hand, the results show that the concave and concavo-convex bus bars 13 as in the second and third examples are suitable for attainment of a stable amount of attenuation in a broad frequency range. The results further show that the frequency range achieving a stable amount of attenuation is enlarged larger as the number of bent portions of the bus bar 13 is increased. In this case, when a part of the bus bar 13 connected to the first capacitor 21 is located nearer the bottom 31 than the part of the bus bar 13 extending through the ferrite core 12 as in examples 2 and 3, the frequency range in which noise is attenuatable can be enlarged.

When the characteristic as a requested level in FIG. 6 is required, the required characteristic can be met by the use of the concave or concavo-convex bus bar 13 of example 2 or 3. As understood from the foregoing, the noise attenuation characteristic changes depending upon the shape of the bus bar 13 without any change in the characteristic of the ferrite core 12 and capacities of the first to third capacitors 21 to 23.

Next, changes in the noise attenuation characteristic depending upon the arrangement of the first to third capacitors 21 to 23 will be studied on the basis of examples 4, 5, 6 and 7 as shown in FIGS. 7, 8, 9 and 10 respectively. Each one of embodiments 4 to 7 includes a bus bar in which both input frame 32 side and output frame 33 side are bent in the same manner as example 3 shown in FIG. 5. Elements other than the shape of bus bar 13 are common to these bus bar devices 10. More specifically, characteristics of the ferrite core 12 and capacities of the first to third capacitors 21 to 23, and the like are common to these bus bar devices 10.

Figure 7:
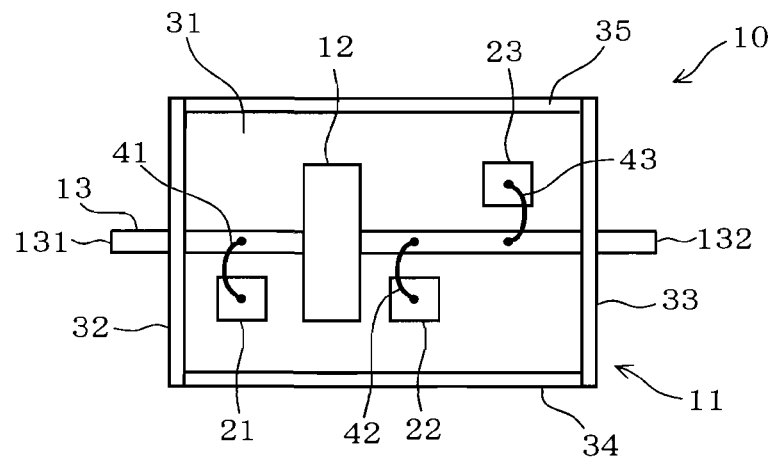
FIG. 7 is a schematic plan view of the bus bar device of example 4 according to the first embodiment.
Figure 8:
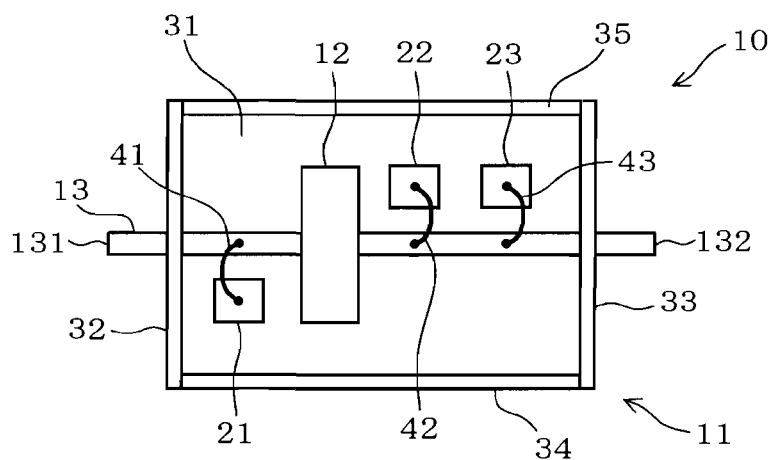
FIG. 8 is a schematic plan view of the bus bar device of example 5 according to the first embodiment.
Figure 9:
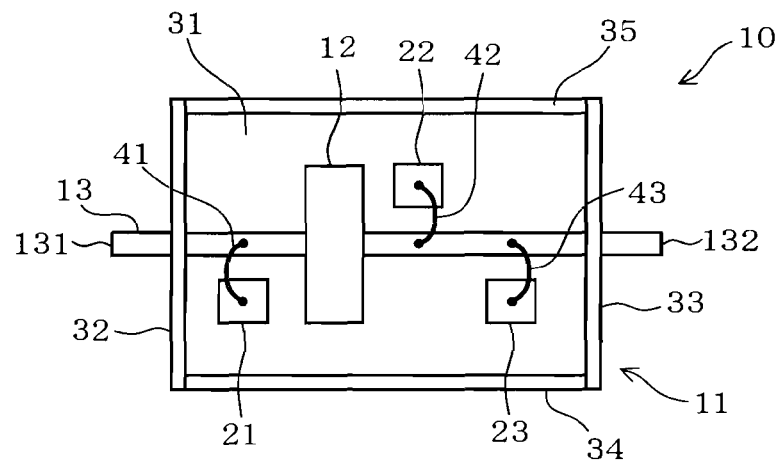
FIG. 9 is a schematic plan view of the bus bar device of example 6 according to the first embodiment.
Figure 10:
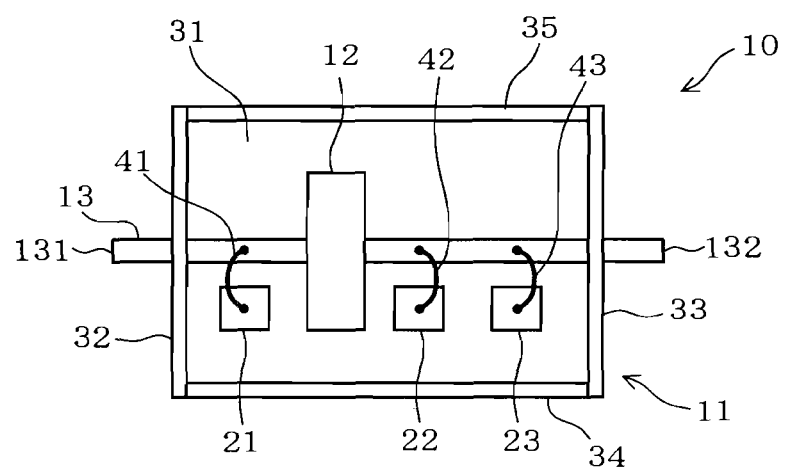
FIG. 10 is a schematic plan view of the bus bar device of example 7 according to the first embodiment.

The first capacitor 21 is disposed in the region at the side frame 34 side of the bus bar 13 in each one of examples 4 to 7. In the bus bar device 10 of example 4 as shown in FIG. 7, the second capacitor 22 is disposed in the same region at the side frame 34 side of the bus bar 13 as the first capacitor 21. On the other hand, the third capacitor 23 is disposed in the region at the side frame 35 side located opposite the first capacitor 21 with the bus bar 13 being located therebetween. In the bus bar device 10 of example 5 as shown in FIG. 8, the second and third capacitors 22 and 23 are disposed in the region at the side frame 35 side located opposite the first capacitor 21 with the bus bar 13 being located therebetween. In the bus bar device 10 of example 6 as shown in FIG. 9, the second capacitor 22 is disposed in the region at the side frame 35 side located opposite the first capacitor 21 with the bus bar 13 being located therebetween. On the other hand, the third capacitor 23 is disposed in the same region at the side frame 34 side of the bus bar 13 as the first capacitor 21. In the bus bar device 10 of example 7 as shown in FIG. 10, the second and third capacitors 22 and 23 are disposed in the same region at the side frame 34 side as the first capacitor 21.

Figure 11:
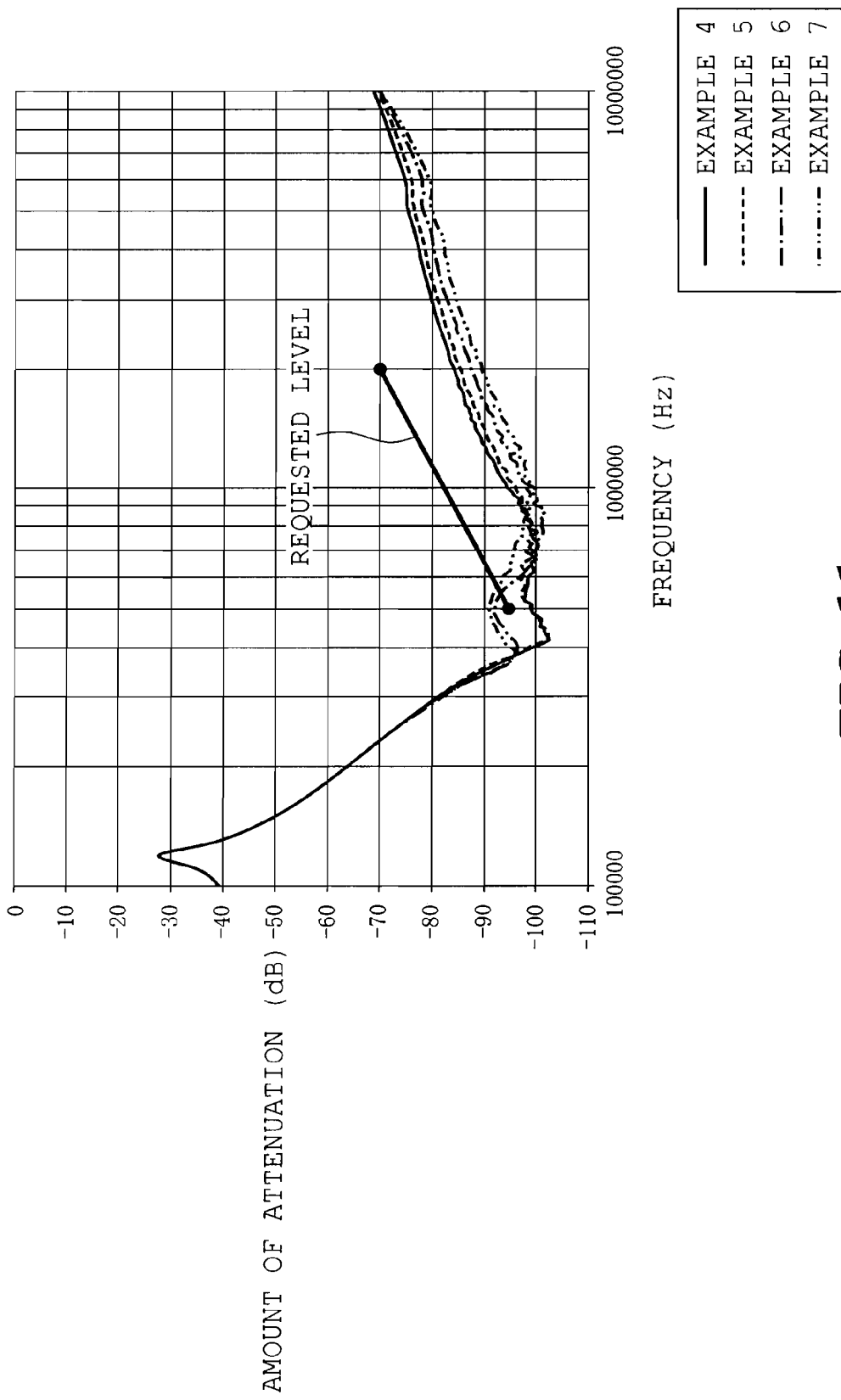
FIG. 11 is a graph showing the relationship between frequency and attenuation.

FIG. 11 shows the relationship between a frequency range and an amount of attenuation in the bus bar devices 10 of examples 4 to 7. It is understood from FIG. 11 that the relationship between the frequency range and the amount of attenuation changes depending upon the positions of the three capacitors. In particular, the position of the second capacitor 22 disposed at the output side of the ferrite core 12 has a great influence on the attenuation characteristic. When the first and second capacitors 21 and 22 at the input side and output side of the ferrite core 12 are located in the same region at the side frame 34 side as in examples 4 and 7, an amount of attenuation tends to be increased in a low frequency range. On the other hand, when the second capacitor 22 is located in the region at the side frame 35 side opposed to the first capacitor 21 as in examples 5 and 6, an amount of attenuation is increased in a high frequency range while reduced in a low frequency range.

When the characteristic as a requested level in FIG. 11 is required, the required characteristic can be met by the disposition of the first and second capacitors 21 and 22 in the same region at the side frame 34 side as in examples 4 and 7. As understood from the foregoing, the noise attenuation characteristic changes by the disposition of the second and third capacitors 22 and 23 relative to the first capacitor 21 without any changes in the characteristic of the ferrite core 12 and capacities of the first to third capacitors 21 to 23.

It is understood from examples 4 to 7 that the positional relationship between the first and second capacitors 21 and 22 has influences particularly on an amount of attenuation in a low frequency range. More specifically, when the first and second capacitors 21 and 22 are disposed in the same region at the side frame 34 side, a large amount of attenuation can be achieved in the low frequency range. On the other hand, when the first and second capacitors 21 and 22 are disposed opposite each other with the bus bar 13 being located therebetween, a larger amount of attenuation can be achieved in a higher frequency range. On the other hand, the positional relationship between the second and third capacitors 22 and 23 contributes to adjustment of the frequency range.

In the foregoing embodiment, as described above, an attenuation amount of noise to be eliminated changes depending upon to which one of the regions divided with the bus bar 13 being located therebetween the first or second capacitor 21 or 22 is connected. Accordingly, even if the electrical characteristics of the ferrite core 12, such as impedance, are constant, a noise elimination characteristic changes by changing connection paths of the first and second capacitors 21 and 22. In other words, no dedicated ferrite core 12, first and second capacitors 21 and 22 need to be designed according to electrical equipment to be connected to the bus bar device 10. The noise elimination characteristic changes by changing the positions of the first and second capacitors 21 and 22. Accordingly, components including the bus bar 13 and the ferrite core 12 can be commonalized, and a noise elimination characteristic can be easily adjusted according to the characteristics of electrical equipment to be connected to the bus bar device 10.

Furthermore, the bus bar device 10 includes the third capacitor 23 in the foregoing embodiment. The third capacitor 23 is provided on the electrical path connecting between the bus bar 13 and the bottom 31 at the position nearer the output frame 33 side than the second capacitor 22. The frequency range of noise to be eliminated changes by changing the connection path of the third capacitor 23 or the region where the third capacitor 23 is connected, in the same manner as the second capacitor 22. Accordingly, even if the electrical characteristics of the ferrite core 12, such as impedance, are constant, the noise elimination characteristic changes by changing the connection paths of the third and other capacitors. More specifically, an attenuation amount of noise to be eliminated is defined depending upon whether or not the first and second capacitors 21 and 22 are connected to the bus bar 13 in the same region or in the different regions. Furthermore, the frequency range of noise to be eliminated is defined depending upon whether or not the second and third capacitors 22 and 23 are connected to the bus bar 13 in the same region or in the different regions. Thus, the frequency range of noise to be eliminated is adjusted with ease and high degree of accuracy according to electrical equipment to be connected, by adjusting positions of the first to third capacitors 21 to 23. This can enhance commonalization of components and adjust the noise elimination characteristic with ease and high degree of accuracy according to characteristics of electrical equipment to be connected.

In the embodiment, furthermore, the bus bar 13 has a part connected to the first capacitor 21. The part of the bus bar 13 is located nearer the bottom 31 than a part of the ferrite core 12 through which the bus bar 13 extends. Thus, a change occurs in the noise elimination characteristic in a particular frequency range when the part of the bus bar 13 to which the first capacitor 21 is connected is caused to come nearer the bottom 31. Accordingly, the frequency range of noise to be eliminated can be easily adjusted by changing the distance between the bus bar 13 and the bottom 31 as well as the capacity of the first capacitor 21. This can enhance commonalization of components and adjust the noise elimination characteristic with ease and high degree of accuracy according to characteristics of electrical equipment to be connected.

In particular, the bus bar 13 is formed into the concave or concavo-convex shape such that the distance to the bottom 31 changes. As a result, an overall length of the bus bar 13 is increased even though the distance from the input frame 32 to the output frame 33 remains unchanged. This changes the capacity of the bus bar 13, resulting in a change in the noise elimination characteristic. Furthermore, forming the bus bar 13 into the concave or concavo-convex shape provides an easy adjustment of the distance between the part of the bus bar 13 extending through the ferrite core 12 and the bottom 31 and the distance between the part of the bus bar 13 to which each capacitor is connected and the bottom 31. Accordingly, the noise elimination characteristic can be easily adjusted without increase in the size of the bus bar device 10.

Second Embodiment

Figure 12:
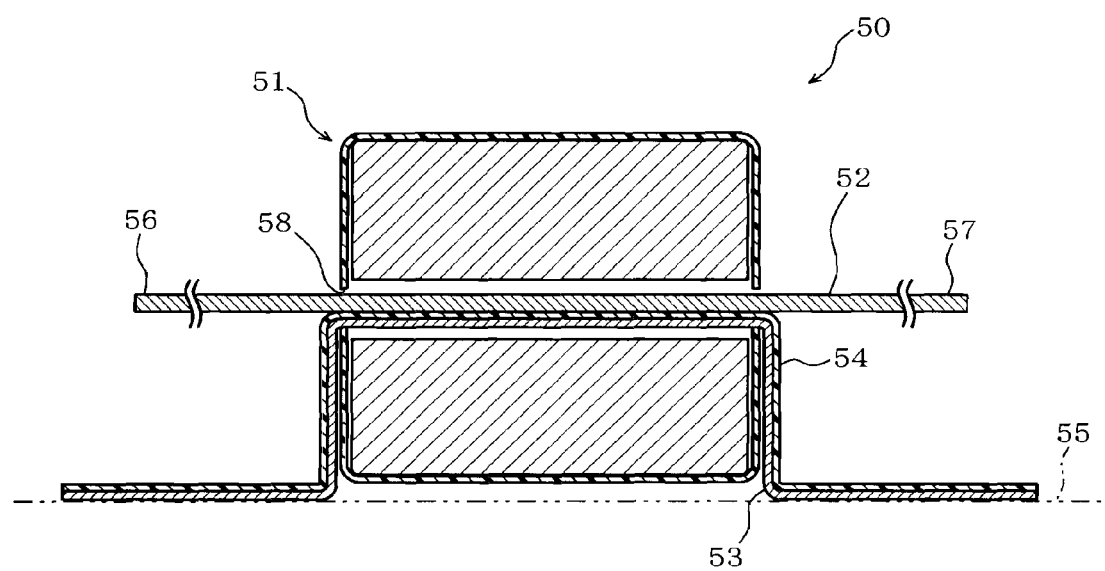
FIG. 12 is a schematic sectional view of the bus bar device with the noise filter according to a second embodiment.
Figure 13:
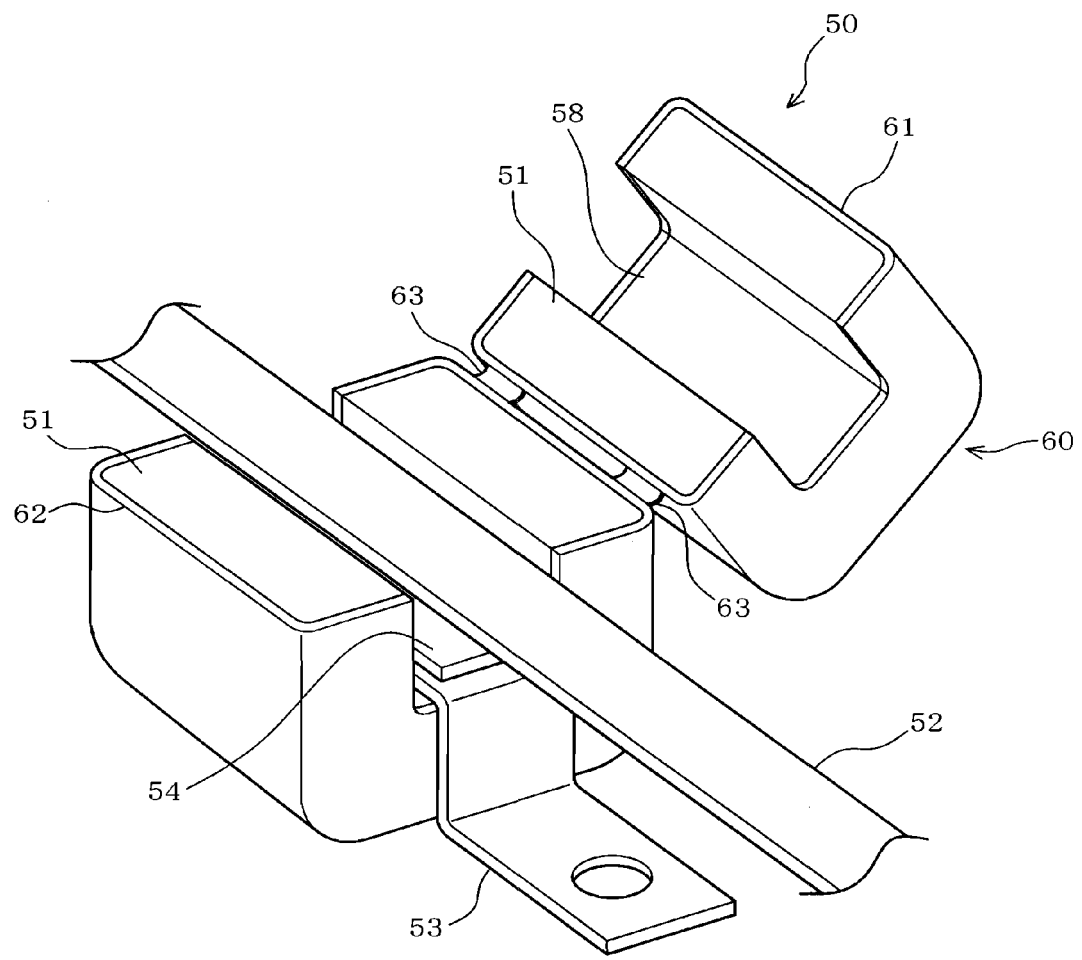
FIG. 13 is a schematic perspective view of the bus bar device.

FIGS. 12 and 13 illustrate a bus bar device 50 of a second embodiment. The bus bar device 50 includes the ferrite core 51 as a magnetic body, the bus bar 52, an earth bar 53 and a dielectric member 54. The bus bar device 50 is mounted on the ground conductor surface 55. The ground conductor surface 55 is included in the casing for housing the bus bar 50 or a metal component exposed in the environment where the bus bar device 50 is installed.

The bus bar 52 is formed of an electrically conductive metal such as copper or aluminum or an alloy. The bus bar 52 has an input end 56 and an output end 57. The bus bar 52 extends through the ferrite core 51 from the input side to the output side. The input end 56 is connected to a power supply (not shown) or the like and the output end 57 is connected to a load such as an electric motor (not shown). Thus, the bus bar 52 connects between the input side such as the power supply and the output side such as a drive device. The bus bar 52 may be linear from the input end 56 to the output end 57 or may be bent midway into a concave or concavo-convex shape.

The ferrite core 51 is provided between the input and output ends 56 and 57 of the bus bar 52. As a result, the bus bar 52 extends through the ferrite core 51. More specifically, the ferrite core 51 has an opening 58 in a central part thereof and is formed into a cylindrical shape. The bus bar 52 extends through the opening of the ferrite core 51. In the embodiment, the ferrite core 51 is formed so as to be dividable into two parts one above the other with the bus bar 52 being interposed therebetween as shown in FIG. 13. The ferrite core 51 is housed in a casing 60 formed of an insulating resin, for example. The casing 60 has an upper case 61 and an inner case 62 both of which house the two divided parts of the ferrite core 51 respectively. The upper and lower cases 61 and 62 are connected to each other by a hinge 63. The hinge 63, which is formed of the resin integrally with the upper and lower cases 61 and 62, is deformable. As a result, the two divided parts of the ferrite core 51 are held together by the casing 60. Furthermore, the upper and lower cases 61 and 62 are caused to pivot relative to each other with the result that the opening 58 is opened and closed. Consequently, the bus bar 52, earth bar 53 and dielectric member 54 are easily inserted into the opening 58 of the ferrite core 51.

The earth bar 53 is formed of an electrically conductive metal such as copper, aluminum or an alloy, for example, as shown in FIGS. 12 and 13. The earth bar 53 also extends through the opening 58 of the ferrite core 51 from the input side to the output side in the same manner as the bus bar 52. The earth bar 53 has two ends at least one of which is connected to the ground conductor surface 55. In this case, both ends of the earth bar 53 may be connected to the ground conductor surface 55 as in the embodiment. In other words, the earth bar 53 is grounded. In the embodiment, the earth bar 53 is bent midway thereby to be formed with stepped portions between both ends and parts extending through the opening 58 of the ferrite core 51.

The dielectric member 54 is formed of a dielectric material and is inserted between the bus bar 52 and the earth bar 53. More specifically, the dielectric member 54 has two thicknesswise end surfaces one of which is in contact with the bus bar 52. The other thicknesswise end surface is in contact with the earth bar 53. Thus, a capacitor is formed between the bus bar 52 and the earth bar 53 by inserting the dielectric member 54 between the bus bar 52 and the earth bar 53. More specifically, the bus bar 52 and the earth bar form the capacitor by inserting the dielectric member 54 therebetween. As a result, an LC filter is configured by the formed capacitor and the ferrite core 51. The dielectric member may be a gas such as air. In this case, the gas such as air is inserted between the bus bar 52 and the earth bar 53.

Figure 14:
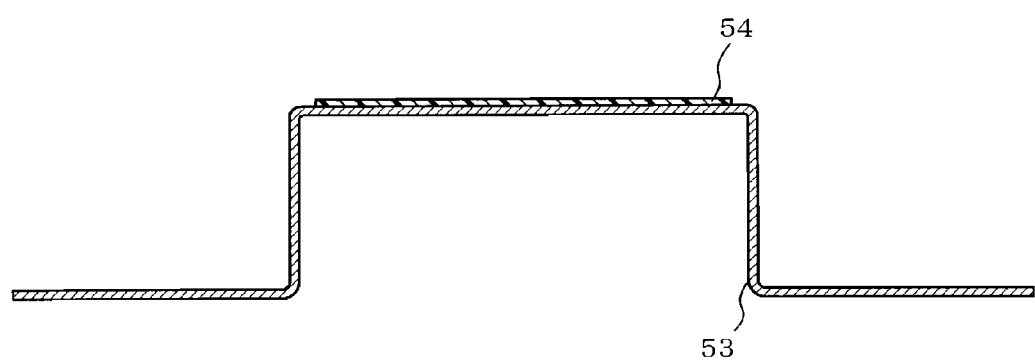
FIG. 14 is a schematic sectional view of a dielectric member of the bus bar device according to the other embodiment.

The dielectric member 54 can be set to any shape and any dielectric constant. For example, the dielectric member 54 may be set to cover a whole part of the earth bar 53 located at the bus bar 52 side, as shown in FIG. 12. On the other hand, the dielectric member 54 may be set to cover a part of the earth bar 53 located at the bus bar 52 side, as shown in FIGS. 13 and 14. Thus, the capacitance of the capacitor formed between the bus bar 52 and the earth bar 53 is optionally changed by changing the shape and the dielectric constant of the dielectric member 54. Consequently, a noise elimination characteristic of the LC circuit formed by the capacitor and the ferrite core 51 can be easily changed optionally.

Thus, in the second embodiment, the bus bar 52 and the earth bar 53 are caused to extend through the opening 58 of the ferrite core 51 and the dielectric member 54 is inserted between the bus bar 52 and the earth bar 53, whereby the capacitor is formed. Accordingly, the ferrite core 51, the bus bar 52, the earth bar 53 and the dielectric member 54 are configured into an integral unit. This can render the handling of the bus bar device 50 easier.

Furthermore, the frequency range of noise to be eliminated is easily adjusted by adjusting the whole length of the dielectric member 54 inserted between the bus bar 52 and the earth bar 53, the shapes of the bus bar 52 and the earth bar 53, and the like. Accordingly, various components including the ferrite core 51 can be commonalized and the noise elimination characteristic can be easily adjusted according to the characteristics of electrical equipment to be connected.

The present invention should not be limited to the foregoing embodiments but may be applied to various embodiments without departing from the gist thereof.

The bus bar device 10 includes the third capacitor 23 in addition to the first and second capacitors 21 and 22 in the first embodiment. However, the third capacitor 23 may not be essential and may be eliminated. Additionally, the number of capacitors should not be limited to three but may be four or above.

The invention claimed is:

1. A bus bar device with a noise filter, comprising:
a magnetic body;
a bus bar having an input end and an output end and extending through the magnetic body;
a first capacitor, provided on an electrical path connecting between the bus bar and a ground conductor surface, for grounding the bus bar, the first capacitor being located at the input end side of the bus bar with respect to the magnetic body, the first capacitor having two ends, one end is connected to the bus bar and the other end is connected to the ground conductor surface in one of two regions divided with the bus bar being located therebetween;
a second capacitor provided on the electrical path connecting between the bus bar and the ground conductor surface and located at the output end side of the bus bar with respect to the magnetic body, the second capacitor having two ends, one end of the second capacitor is connected to the bus bar and the other end of the second capacitor is connected to the ground conductor surface in the same region as the first capacitor or in the other region; and
a third capacitor provided on the electrical path and located at the output end side of the bus bar with respect to the magnetic body, the third capacitor having two ends, one end of the third capacitor is connected to the bus bar and the other end of the third capacitor is connected to the ground conductor surface in the same region as the first capacitor or in the other region.

2. The bus bar device according to claim 1, wherein the bus bar has a part connected to the first capacitor, the part being located nearer the ground conductor surface than another part of the bus bar extending through the magnetic body.

3. The bus bar device according to claim 2, wherein the bus bar includes a concave part or is formed into a concavo-convex shape such that a distance to the ground conductor surface changes.

4. A bus bar device with a noise filter, comprising:
a magnetic body;
a bus bar having an input end and an output end and extending through the magnetic body;
an earth bar formed of an electrically conductive material and extending through the magnetic body, the earth bar having two ends, at least one of the two ends is connected to a ground conductor surface; and
a dielectric member formed of a dielectric material and located between the bus bar and the earth bar, thereby forming a capacitor between the bus bar and the earth bar.

\* \* \* \* \*